(12) United States Patent
Renaud

(10) Patent No.: US 11,522,081 B2
(45) Date of Patent: Dec. 6, 2022

(54) HIGH VOLTAGE SEMICONDUCTOR DEVICE AND METHOD OF FABRICATION

(71) Applicant: NXP USA, Inc., Austin, TX (US)

(72) Inventor: Philippe Renaud, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 241 days.

(21) Appl. No.: 17/108,422

(22) Filed: Dec. 1, 2020

(65) Prior Publication Data

US 2021/0083107 A1 Mar. 18, 2021

Related U.S. Application Data

(62) Division of application No. 16/124,444, filed on Sep. 7, 2018, now Pat. No. 10,886,399.

(51) Int. Cl.
| | |
|---|---|
| *H01L 29/78* | (2006.01) |
| *H01L 29/40* | (2006.01) |
| *H01L 29/08* | (2006.01) |

(52) U.S. Cl.
CPC ...... *H01L 29/7816* (2013.01); *H01L 29/0878* (2013.01); *H01L 29/0886* (2013.01); *H01L 29/404* (2013.01)

(58) Field of Classification Search
CPC ............... H01L 29/7835; H01L 29/404; H01L 29/0886; H01L 29/7816
See application file for complete search history.

(56) References Cited

U.S. PATENT DOCUMENTS

| | | | |
|---|---|---|---|
| 9,876,069 B1 * | 1/2018 | Lin | ................... H01L 29/66689 |
| 2008/0017921 A1 * | 1/2008 | Jung | ............... H01L 21/823418 |
| | | | 257/E21.624 |

* cited by examiner

*Primary Examiner* — Dale E Page
*Assistant Examiner* — Wilner Jean Baptiste

(57) ABSTRACT

A semiconductor device, such as a laterally diffused metal-oxide-semiconductor (LDMOS) transistor, includes a semiconductor substrate in which a source region and a drain region are disposed. The drain region has a drain finger terminating at a drain end. A gate structure is supported by the semiconductor substrate between the source region and the drain region, the gate structure extending laterally beyond the drain end. A drift region in the semiconductor substrate extends laterally from the drain region to at least the gate structure. The drift region is characterized by a first distance between a first sidewall of the drain finger and a second sidewall of the gate structure, and the gate structure is laterally tilted away from the drain region at the drain end of the drain finger to a second distance that is greater than the first distance.

8 Claims, 4 Drawing Sheets

20

PRIOR ART

PRIOR ART us11522081b2
HIGH VOLTAGE SEMICONDUCTOR DEVICE AND METHOD OF FABRICATION

RELATED INVENTION

This application is a Divisional of co-pending U.S. patent application Ser. No. 16/124,444, filed on 7 Sep. 2018.

TECHNICAL FIELD OF THE INVENTION

The present invention relates generally to semiconductor devices. More specifically, the present invention relates to a high voltage semiconductor device having a homogeneous breakdown voltage.

BACKGROUND OF THE INVENTION

Integrated circuits (ICs) and other electronic devices often include arrangements of interconnected field-effect transistors (FETs), also called metal-oxide-semiconductor field-effect transistors (MOSFETs), or simply MOS transistor or devices. A typical MOS transistor includes a gate electrode as a control electrode and spaced-apart source and drain electrodes. A control voltage applied to the gate electrode controls the flow of current through a controllable conductive channel between the source and drain electrodes.

Power transistor devices are designed to be tolerant of the high currents and voltages that are present in some applications. One type of power transistor device is a laterally diffused metal-oxide-semiconductor (LDMOS) transistor. In an LDMOS transistor, charge carriers drift through a drift region between a channel region and the drain electrode under the electric field arising from an operating voltage applied between the source and drain electrodes. LDMOS transistors are often used in applications in which the transistors are required to withstand high breakdown voltages and operate at a low on-resistance. LDMOS transistors are used in these applications because they can operate with high efficiency and their planar structure enables relatively easy integration on a semiconductor die with other circuitry.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail a semiconductor device, an electronic apparatus including the semiconductor device, and a method of fabricating the semiconductor device. More specifically, embodiments include a field-effect transistor (FET), such as a laterally diffused metal-oxide-semiconductor (LDMOS) transistor, with a homogeneous and optimized source-to-drain breakdown voltage ($BV_{DSS}$). The breakdown voltage is made homogeneous along the drain finger through the implementation of a drain finger termination configuration in which the area of a drift region is gradually increased in proximity to a drain end of a drain finger to obtain a well-distributed avalanche current at the breakdown voltage along the length of the drain finger. This well-distributed, or homogeneous, avalanche current may enable lower on-state resistance ($R_{ON}$) at high breakdown voltages, thereby enhancing transistor performance and robustness.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming fabrication techniques of depositing, patterning, etching, and so forth. Accordingly, although different shading and/or hatching is utilized in the illustrations, the different elements within the structural layers may be formed out of the same material.

Figure 1:
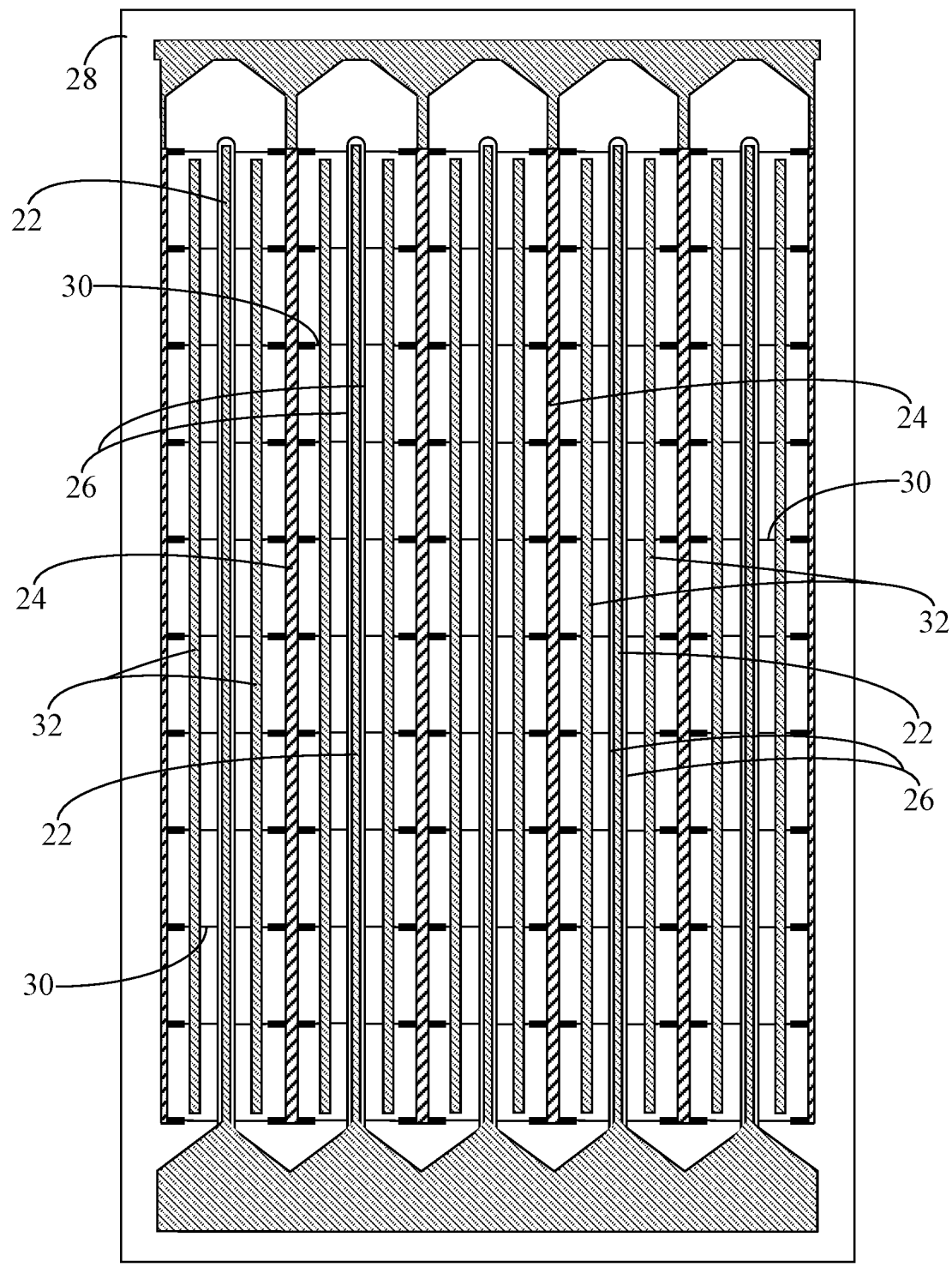
FIG. 1 shows a simplified plan view of an example of a prior art transistor having interdigitated drain and gate fingers.

Referring to FIG. 1, FIG. 1 shows a simplified plan view of an example of a transistor device 20 having interdigitated drain and gate runners 22, 24. That is, drain and gate runners 22, 24 are closely positioned relative to one another in an alternating arrangement. Heavily doped regions 26 (e.g., N+) generally surround drain regions (typically located below drain runners 22, not visible) formed within a semiconductor substrate 28 of an intrinsic device underlying drain and gate runners 22, 24. Transistor 20 can further include a plurality of tap interconnects 30 formed from electrically conductive material, typically metal. Tap interconnects 30 may be electrically connected between gate runners 24 and gate taps or gate electrodes of regions 26 formed within semiconductor substrate 28. Transistor 20 may include shield runners 32 interposed between each pair of drain and gate runners 22, 24 that may reduce some feedback capacitance between drain and gate runners 22, 24. The interdigitated drain, gate, and shield runners 22, 24, 32 may be formed in one or more metal layers above semiconductor substrate 28.

Figure 2:
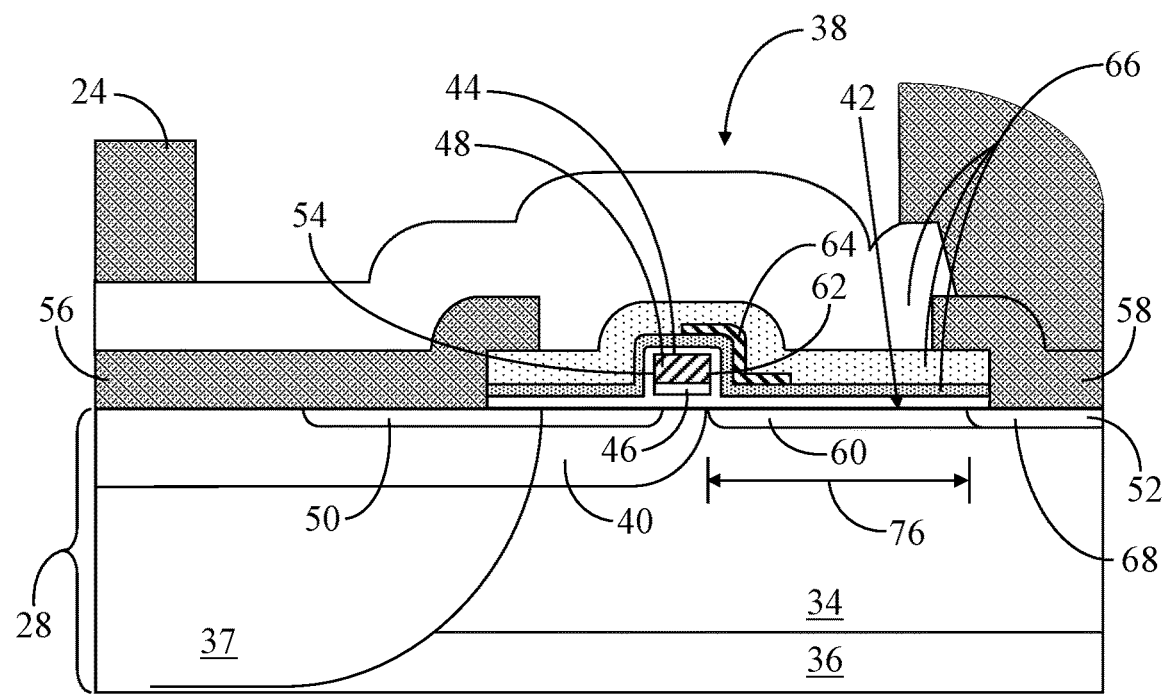
FIG. 2 depicts a side sectional view of a portion of a transistor.

FIG. 2 depicts a partial side sectional view of a portion of transistor device 20. Transistor device 20 may be configured as an LDMOS field-effect transistor (FET) device. Transistor device includes semiconductor substrate 28, which may, in turn, include a number of material layers. For example, in the representative transistor device 20, semiconductor substrate 28 includes at least one epitaxial layer 34 formed over a highly conductive silicon substrate 36, a sinker region 37, and various other heavily doped and lightly doped P and N regions in accordance with a design configuration.

A device area 38 is depicted in FIG. 2. Device area 38 may include or correspond with one or more active areas of transistor 20. In some configurations, device area 38 may be defined by one or more doped isolating regions (not numbered) in semiconductor substrate 28. The doped isolating region(s) may surround device area 38. These regions may act as a barrier separating device area 38 from other portions of semiconductor substrate 28. For example, device area 38 may be further defined via a moderately or heavily doped isolating well laterally surrounding device area 38. Device area 38 may alternatively or additionally be defined by one or more isolation regions, such as a shallow trench isolation (STI) region, a deep trench isolation (DTI) region, or a field oxide region (fieldox).

Transistor 20 may further include a well or diffused region 40 in semiconductor substrate 28. During operation, a channel or channel region is formed in well region 40 at a surface 42 of semiconductor substrate 28. The channel is formed under a gate structure 44 of transistor 20 via application of a bias voltage from gate runner 24 and tap interconnects 30 (FIG. 1) to a conductive portion (e.g., polysilicon layer) 46 of gate structure 44. Well region 40 may be a region formed by lateral diffusion under gate structure 44. Well region 40 may be considered a body or base region of transistor 20. Well region 40 may be configured to establish a desired threshold voltage and/or other operational parameters of transistor 20.

Gate structure 44 is formed on or above semiconductor substrate 28 over well region 40. Gate structure 44 may include an oxide or other dielectric layer (not numbered) disposed on surface 42. For example, the dielectric layer may include silicon dioxide (or oxide) grown, deposited, or otherwise formed on surface 42. Gate structure 44 may include any number of dielectric layers. The dielectric layers spaces polysilicon or other conductive layer 46 of gate structure 44 from well region 40. One or more metal interconnect layers 48 may, in turn, be disposed on polysilicon layer 46. Gate structure 44 may include additional components. For example, gate structure 44 may include one or more dielectric sidewall spacers along lateral edges of gate structure 44. The sidewall spacers may cover the lateral edges to act as a silicide block to prevent a silicide short along surface 42 of semiconductor substrate 28. The sidewall spacers may provide spacing to separate the conductive components of gate structure 44 from other structures or components of transistor 20. The materials, shape, construction, and other characteristics of gate structure 44 may vary from the illustrated example. Further, transistor 20 may include multiple gate structures 44.

Transistor 20 further includes a heavily doped source region 50 and a drain region 52 disposed in semiconductor substrate 28. Source region 50 and drain region 52 are laterally spaced from one another at surface 42 of semiconductor substrate 28. Gate structure 44 is supported by semiconductor substrate 28 between source region 50 and drain region 52. Source region 50 may be disposed along or aligned with a source-side sidewall (referred to herein as a first sidewall 54) of gate structure 44. Alternatively, source region 50 may have lateral spacing away from first sidewall 54. Any number of source regions 50 and drain regions 52 may be provided. For example, drain region 50 may be centered or otherwise disposed between, or laterally surrounded by two portions of source region 52 or two separate source regions. In general, source region 50 and drain region 52, or a portion thereof, may have a dopant concentration at a level sufficient to establish ohmic contacts with electrodes or interconnects 56 and 58, for biasing or applying voltages to source region 50 and drain region 52, respectively.

Transistor 20 additionally includes a drift region 60 in semiconductor substrate 28 between well region 40 and drain region 52. In the example, of FIG. 2, drift region 60 may be established via the formation of a well (e.g., an n-type well). The n-type well may be configured for high voltage device operation, and is thus sometimes referred to as an n-type high voltage (NHV) well. Drift region 60 may support the creation of an accumulation region under gate structure 44. Drift region 60 laterally extends from a drain-side sidewall (referred to herein as a second sidewall 62) of gate structure 44 to drain region 52. The lateral extension of drift region 60 allows charge carriers (e.g., electrons) in the channel region to reach drain region 52 during operation.

Transistor 20 may include a Faraday or other shield 64 disposed along or over a portion of drift region 60 and second sidewall 62 of gate structure 44. Shield 64 may include one or more field plates that extend over a portion of gate structure 44 and/or drift region 60. Transistor 20 may include one or more passivation layers 66 covering surface 42. In some configurations, shield 64 may be disposed between two of the passivation layers 66. Shield 64 may help protect the dielectric layer of gate structure 44 from damage or degradation arising from charge carriers accelerated under the electric field arising from the drain-source voltage. Shield 64 may also help to reduce the maximum electric field in drift region 60. Shield 64 may be grounded or otherwise biased to deter injection of hot carriers into the oxide or other dielectric material under gate structure 44 and/or the oxide or other dielectric material over drift region 60.

Transistor 20 is shown in simplified form in FIG. 2. For example, FIG. 2 does not show a number of metal layers configured for electric connections with source region 50, with drain region 52 (e.g., conductive pillars interconnecting drain region 52 with drain runners 22 of FIG. 1), and with gate structure 44 (e.g. conductive structures interconnecting gate structure with tap interconnects 30 and gate runners 24 of FIG. 1). Transistor 20 may have a number of other structures or components for connectivity, isolation, passivation, and other purposes not shown in FIG. 2 for ease of illustration.

To enhance capacity, the source and drain regions (e.g., source and drain regions 50, 52) of power-switching transistors are typically formed as multiple interdigitated source and drain fingers connected in parallel. Thus, the surface topography of an LDMOS transistor is typically configured using the interdigitated source and drain finger with tips, referred to herein as termination ends, at the ends of the fingers. Further, each of the drain fingers is typically surrounded by the gate structures (e.g., gates 26 of FIG. 1, gate structure 44 of FIG. 2).

Figure 3:
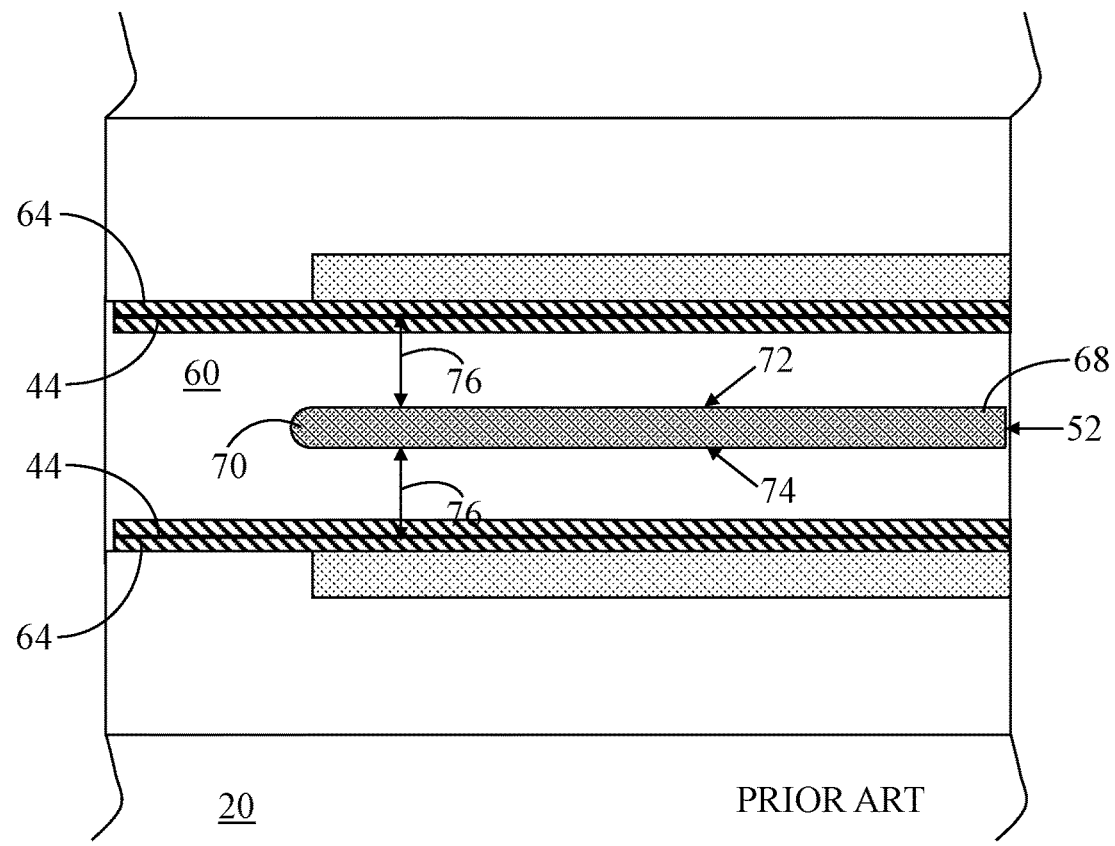
FIG. 3 shows an enlarged plan view of a portion of the prior art transistor of FIG. 1.

With reference to FIGS. 2 and 3, FIG. 3 shows an enlarged plan view of a portion of the prior art transistor 20. In FIG. 3, a portion of drain region 52 is shown. In general, drain region 52 includes a drain finger 68 terminating at a drain end 70. In this enlarged view, only a portion of drain finger 68 is shown. In an actual configuration, drain finger 68 may be relatively longer than that shown and may have another drain end on the opposing end of drain finger 68. FIG. 3 further shows shields 64 (represented by downwardly and rightwardly directed hatching) overlaying gate structures 44 (represented by a relatively thick black line) laterally displaced away from opposing sidewalls 72, 74 of drain finger 68. Other details and components of transistor 20 are not identified and/or included in FIG. 3 for simplicity.

Breakdown voltage, $BV_{DSS}$, is the voltage at which the reverse-biased body-drift diode breaks down and significant current starts to flow between the source and drain by the avalanche multiplication process, while the gate and source are shorted together. In lateral power MOS transistors (e.g., LDMOS transistors), surface and three-dimensional effects are important factors that may affect avalanche breakdown, hence the high voltage capability. To alleviate these factors, some design and process optimization may be implemented such as the inclusion of shield plates (e.g., shield 64) and particular doping profiles. The field plates and optimized doping profiles may be relatively effective when considering purely one-dimensional or two-dimensional effects. However, field plates and optimized doping profiles may be insufficient at the termination ends of the fingers. For example, the avalanche current in high voltage devices may be concentrated at the termination ends (e.g., drain end 70) of the drain fingers (e.g., drain fingers 68), resulting in the transistor device being less robust and/or voltage limited.

The area between the gate structure (e.g., gate structure 44) and the drain region (e.g., drain region 52) is typically referred to as the drift region (e.g., drift region 60 in this example). A distance 76 of the drift region between drain finger 68 and gate structure 44 may be calculated according to a desired breakdown voltage. For example, an increase in distance 76 of drift region 60 correspondingly increases the breakdown voltage, $BV_{DSS}$. In accordance with an embodiment described below, the gate to drain distance is gradually increased at the drain ends of the drain fingers to locally increase the breakdown voltage, $BV_{DSS}$. Such a configuration may enable the avalanche current to become more homogeneously distributed along the drain fingers instead of being concentrated at the termination ends. This homogeneous avalanche current may enable lower on-state resistance ($R_{ON}$) at high breakdown voltages, thereby enhancing transistor performance and robustness.

Figure 4:
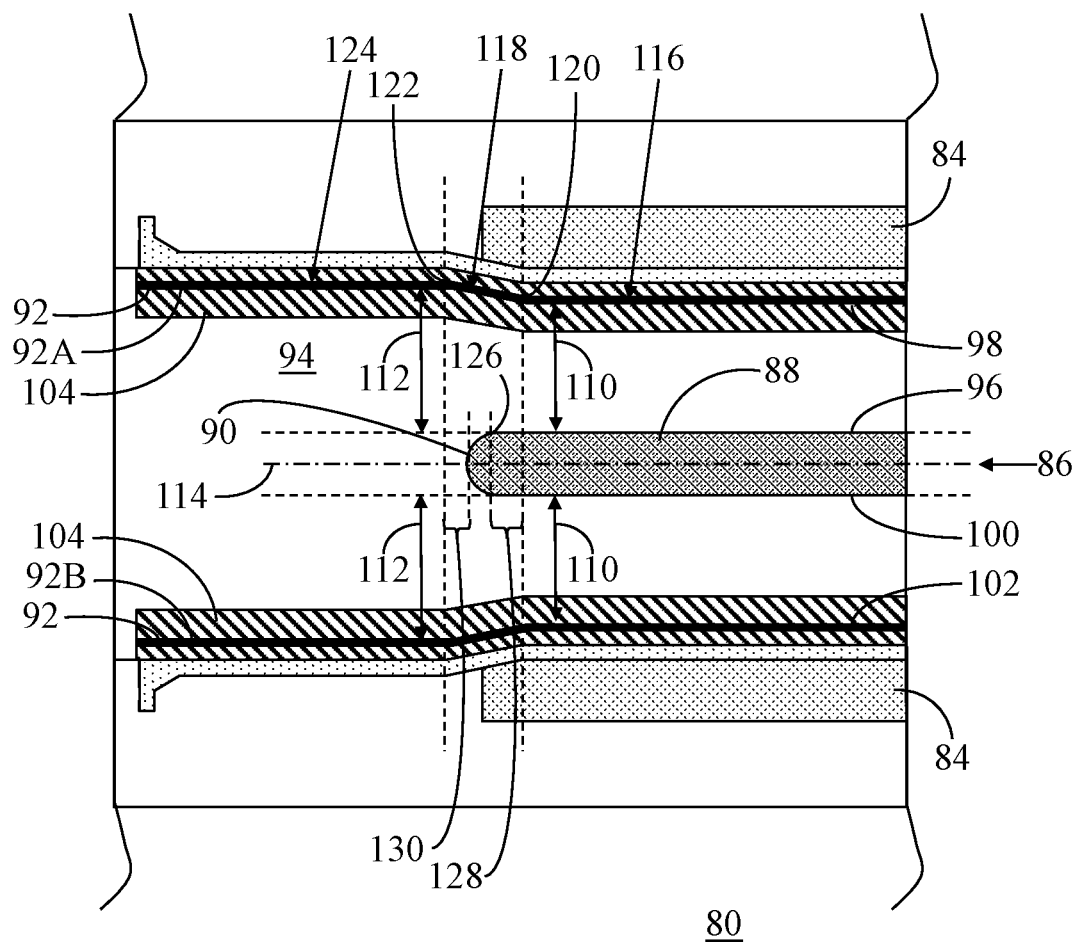
FIG. 4 shows an enlarged plan view of a portion of a transistor in accordance with an embodiment.
Figure 5:
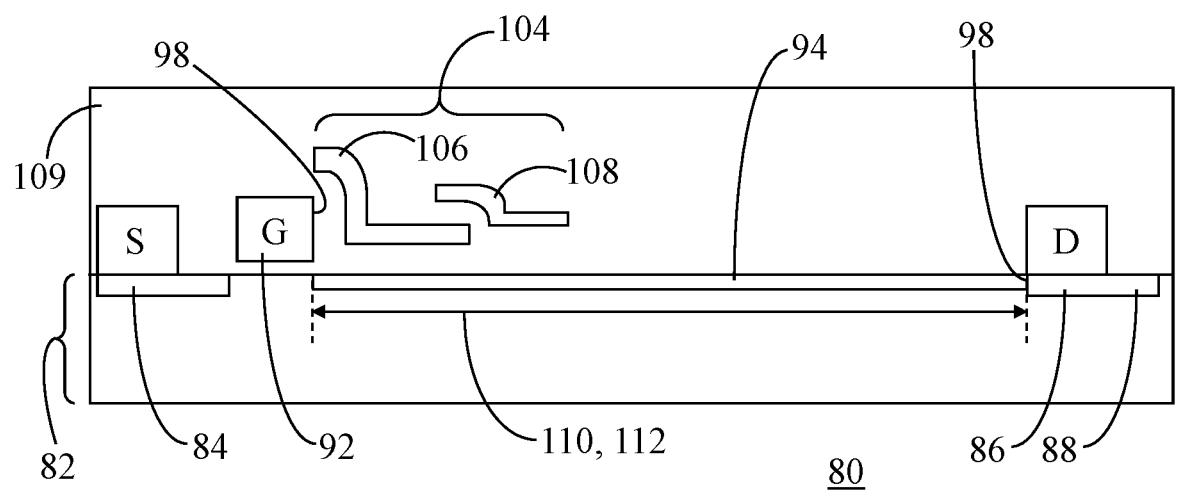
FIG. 5 shows a pictorial sectional view of the transistor of FIG. 4.

Referring now to FIGS. 4 and 5, FIG. 4 shows an enlarged plan view of a portion of a transistor 80 in accordance with an embodiment and FIG. 5 shows a pictorial sectional view of transistor 80. Transistor 80 is a semiconductor device, such as, for example, a laterally diffused metal oxide semiconductor (LDMOS) field-effect transistor (FET) device. The source and gate regions of transistor 80 may include a plurality of source and drain fingers in which gate structures surround the drain fingers, as discussed above. Accordingly, although transistor 80 is described below as having a source finger and a drain finger. It should be understood that transistor 80 may include multiple interdigitated source and drain fingers connected in parallel which may be implemented in, for example, power-switching transistors.

Transistor 80 includes a semiconductor substrate 82 in which a source region 84 and a drain region 86 (both of which are represented by blocks in FIG. 5) are disposed. Drain region 86 includes a drain finger 88 terminating at a drain end 90. In the enlarged view of FIG. 4, only a portion of drain finger 88 is shown. In an actual configuration, drain finger 88 may be considerably longer and another drain end may be present at the opposing end of drain finger 88. Gate structures 92 (represented by relatively thick black lines in FIG. 4 and represented by a block in FIG. 5) are supported by semiconductor substrate 82 between source region 84 and drain finger 88 of drain region 86. Gate structures 92 extend laterally beyond drain end 90 (e.g., leftward on the page beyond drain end 90 in FIG. 4).

Transistor 80 further includes a drift region 94 in semiconductor substrate 82. Drift region 94 extends laterally from a gate-side sidewall (referred to herein as a first sidewall 96) of drain finger 88 to at least a drain-side sidewall (referred to herein as a second sidewall 98) of one of gate structures 92 (labeled 92A in FIG. 4). As represented in FIG. 4, drift region 94 also extends laterally from another gate-side sidewall (referred to herein as a third sidewall 100) of drain finger 88 to at least another drain-side sidewall (referred to herein a fourth sidewall 102) of the other one of gate structures 92 (labeled 92B in FIG. 4).

Shields 104 (represented by rightwardly and downwardly directed wide hatching) are disposed over a portion of drift region 94 and at least a portion of gate structures 92. In some embodiments, shields 104 may include at least two field plates 106, 108 as illustrated. In other embodiments, shields 104 may include a single field plate, as illustrated in FIG. 2. Other material layers (e.g., passivation layers 66 discussed in connection with FIG. 2) may additionally be disposed on or in semiconductor substrate 82. These material layers, other details, and components of transistor 80 are not identified and/or included in FIGS. 4 and 5 for brevity. Nevertheless, they can include epitaxial layers, well regions, heavily or lightly doped regions, isolating regions, passivation layers, interconnects, runners, and the like.

In accordance with an embodiment, drift region 94 is characterized by a first distance 110 between first sidewall 96 of drain finger 88 and second sidewall 98 of gate structure 92A. Equivalently, drift region 94 is characterized by first distance 110 between third sidewall 100 of drain finger 88 and fourth sidewall 102 of the other gate structure 92B. Gate structures 92 are laterally tilted away from drain region 86 at drain end 90 to a second distance 112 that is greater than first distance 110. In FIG. 5, reference numerals 110, 112 for both distances are shown to represent this variable gate to drain distance. For ease of explanation, the tilted configuration and resulting increased distance in drift region 94 is described between first sidewall 96 of drain finger 88 and second sidewall 98 of gate structure 92A. However, the ensuing discussion applies equivalently to drift region 94 between third sidewall 100 of drain finger 88 and fourth sidewall of the other gate structure 92B.

Drain finger 88 and drain end 90 of drain region 86 are characterized by a longitudinal centerline 114. Gate structure 92A includes a first section 116 aligned substantially parallel to drain finger 88. Drift region 94 between first section 116 of gate structure 92A and drain finger 88 exhibits first distance 110. Gate structure 92A further includes a tilt section 118 having a first end 120 and a second end 122, with first end 120 of tilt section 118 is coupled with first section 116 of gate structure 92A. Tilt section 118 deviates laterally away from longitudinal centerline 114 of drain region 86 at drain end 90. That is, first end 120 of tilt section 118 is closer to centerline 114 than second end 122 of tilt section. In some embodiments, gate structure 92A may include a second section 124 coupled to second end 122 of tilt section 118. Second section 124 may be aligned substantially parallel to first section 116 and may extend beyond drain end 90. Second section 124 may eventually terminate with a termination end, a curved section, a relatively sharp bend, and so forth in accordance with a particular design configuration.

In some embodiments, first end 120 of tilt section 118 of gate structure 92A is spaced apart from drain finger 88 near a junction 126 between drain finger 88 and drain end 90. For example, first end 120 of tilt section 118 may be positioned a small distance 128 (e.g., approximately five microns) inward from junction 126 such that the lateral tilting of tilt section 118 begins at drain finger 88 before drain end 90. Further, second end 122 of tilt section 118 may be positioned beyond drain end 90. For example, second end 122 may be positioned a small distance 130 (e.g., at least one micron) past drain end 90 such that the lateral tilting of tilt section 118 ends beyond drain end 90. In some configurations, the gate-to-drain distance may be gradually increased along tilt section 118 such that the difference between second distance 112 and first distance 110 is approximately one micron.

Thus, gate structure 92A is laterally tilted away from drain region 86 at each drain end 90 of each drain finger 88 to gradually increase an area of drift region 94 at each drain end 90. This relative increase of the area of drift region 94 at each drain end 90 may enable a well-distributed, homogeneous, avalanche current at the breakdown voltage along the drain fingers 88 of transistor 80. Accordingly, a breakdown voltage of LDMOS transistor 80 may be optimized and stabilized by the localized increase of the area of drift region 94 at each drain end 90. The approximately one micron change in distances 112, 110 along tilt section 118 to locally increase the area of drift region 94 may be sufficient for stabilizing the breakdown voltage of LDMOS transistor 80. However, it should be understood that the various distances 128, 130 and the difference between second distance 112 and first distance 110 are provided as an example, and that greater or smaller distances may be suitable for yielding the desired effect.

In some embodiments that include shields 104 and/or other material layers 109 (e.g. source region 84) that are aligned with gate structures 92, these shields 104 (e.g., as a single shield or as multiple field plates 106, 108) and/or other material layers 109 are also laterally tilted away from drain region 86 at drain ends 90 in correspondence with gate structures 92. Thus, as generally illustrated in FIG. 4, shields 104, source region 84, and other structures (not numbered) may also laterally tilt away from drain region 86 at drain end 90.

Figure 6:
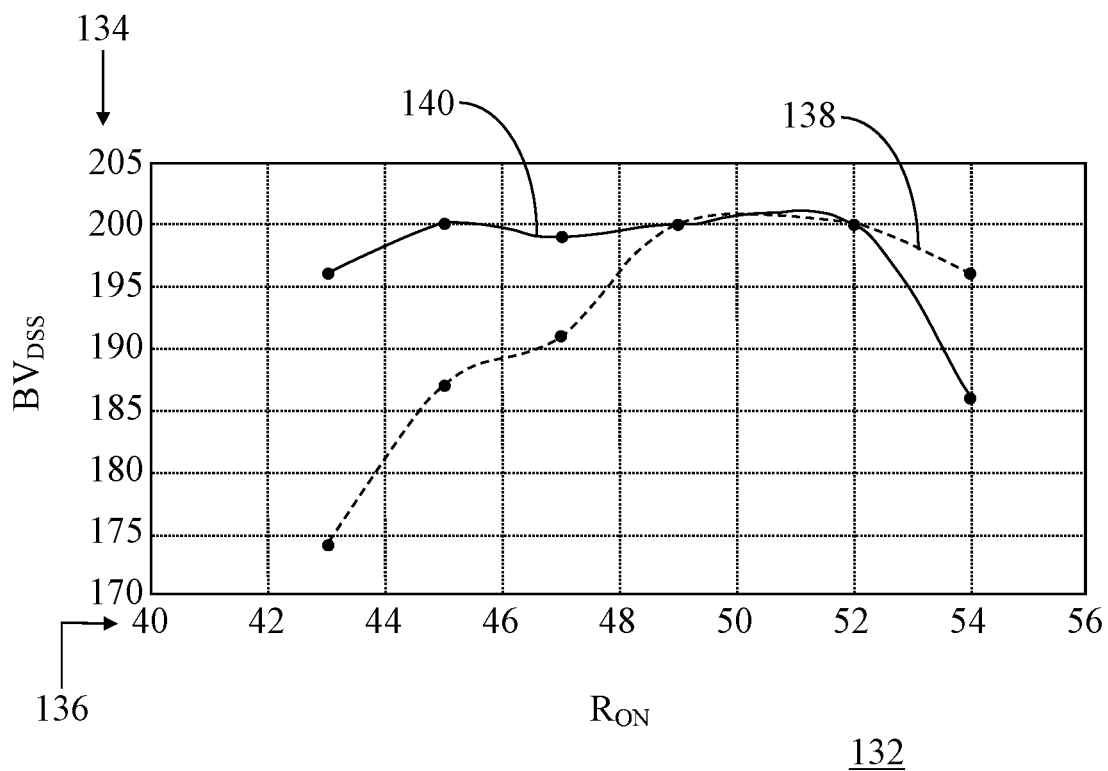
FIG. 6 shows a graph of a relationship of breakdown voltage versus on-state resistance for a prior art transistor and a transistor in accordance with the embodiment of FIG. 4.

FIG. 6 shows a graph 132 of a relationship of breakdown voltage, $BV_{DSS}$, 134 versus on-state resistance, $R_{ON}$, 136 for a prior art transistor (e.g., transistor 20, FIG. 3) and a transistor in accordance with an embodiment (e.g., transistor 80, FIG. 4). More particularly, a dashed curve 138 represents experimental results for a prior art transistor that does not have the localized increase of the area of the drift region at the drain ends. A dashed curve 140 represents experimental results for a transistor (e.g., transistor 80, FIG. 4) that includes the localized increase of the area of the drift region at the drain ends.

When a power (MOSFET) transistor is in the on-state, it exhibits a resistive behavior between the drain and source terminals. This resistance is referred to as the on-state resistance, or as the drain-to-source on-state resistance. In many applications (e.g., power amplifiers, RF amplifiers, and so forth), the transistors are required to withstand high breakdown voltages and operate at a low on-resistance. To withstand high breakdown voltages, one approach may be to make long and lightly doped drift regions. However, drift length and light doping can lead to large on-state resistance and therefore to higher drop voltages, and higher power loss. Additionally, long, lateral drift regions can lead to larger chip size requirements, which increases costs. Accordingly, in typical MOSFET and LDMOS designs there is a tradeoff between its voltage rating (e.g., the breakdown voltage) and its on-state resistance of the device.

This tradeoff is represented by dashed curve 138. In particular, dashed curve 138 of experimental results reveals that at the desired low on-state resistance values 136, breakdown voltage 134 may be undesirably low as well. Thus, in order to achieve sufficiently high breakdown voltage, the on-state resistance will also be high. In contrast, solid curve 140 of experimental results for a transistor (e.g., transistor 80, FIG. 4) having the laterally outwardly tilted gate structures at the drain ends reveals that at the desired low on-resistance values 136, breakdown voltage 134 can be significantly higher. That is, the effect of the angled gate structures 92 is visible in the instances of low on-state resistance values. Accordingly, the angle gate structures 92 enables a higher breakdown voltage for lower on-state resistance values 136 relative to the prior art transistor represented by dashed curve 138.

Figure 7:
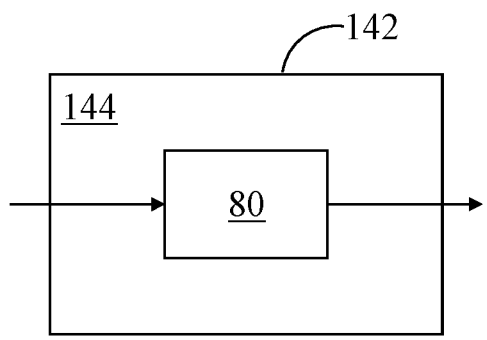
FIG. 7 shows a block diagram of an electronic apparatus that includes at least one transistor of FIG. 4.

FIG. 7 shows a block diagram of an electronic apparatus 142 that includes at least one transistor 80 (FIG. 4) having the laterally outwardly tilted drift regions at the drain ends. Electronic apparatus 142 includes a substrate 144 having any quantity of interconnected LDMOS field-effect transistor devices 80 disposed on or in substrate 144. Further, electronic apparatus 142 can further include a multiplicity of other components disposed on or in substrate 144, such as phase shifters, power splitters, matching networks, fixed-value passive components, discrete and/or integrated components (e.g., inductors, resistors, and capacitors), input/output terminals, and so forth in accordance with a particular design. Electronic apparatus 144 may be configured as a power-switching transistor device, a microwave/RF power amplifier, or any other electronic apparatus in which a low on-state resistance and high breakdown voltage (e.g., $BV_{DSS}$>60V) may be required.

Methodology for transistor 80 (FIG. 5) entails forming a source region and a drain region in a semiconductor substrate, the drain region having a drain finger and a drain end contiguous with the drain finger and forming a gate structure supported by the semiconductor substrate between the source region and the drain region, the gate structure extending laterally beyond the drain end. The methodology further entails forming a drift region in the semiconductor substrate, the drift region extending laterally from the drain region to at least the gate structure, the drift region being characterized by a first distance between a first sidewall of the drain finger and a second sidewall of the gate structure, wherein the gate structure is laterally tilted away from the drain region at the drain end to a second distance that is greater than the first distance. Methodology may further entail forming material layers aligned with the gate structure, the material layers being laterally tilted away from the drain region at the drain end in correspondence with the gate structure, the material layers including at least a shield. LDMO fabrication techniques may be implemented to form the laterally tilted structures (e.g., gate structure, shield, and other material layers) by suitably structured mask design.

Embodiments entail a semiconductor device, an electronic apparatus including the semiconductor device, and a method of fabricating the semiconductor device. An embodiment of a semiconductor devices comprises a semiconductor substrate in which a source region and a drain region are disposed, the drain region having a drain finger terminating at a drain end, a gate structure supported by the semiconductor substrate between the source region and the drain region, the gate structure extending laterally beyond the drain end, and a drift region in the semiconductor substrate, the drift region extending laterally from the drain region to at least the gate structure, the drift region being characterized by a first distance between a first sidewall of the drain finger and a second sidewall of the gate structure, wherein the gate structure is laterally tilted away from the drain region at the drain end to a second distance that is greater than the first distance.

An embodiment of an electronic apparatus comprises a substrate and a field-effect transistor device disposed on the substrate. The field-effect transistor device comprises a source region and a drain region disposed in a semiconductor substrate, the drain region having a drain finger terminating at a drain end, the drain region being characterized by a longitudinal centerline. A gate structure is supported by the semiconductor substrate between the source region and the drain region, the gate structure extending laterally beyond the drain end. The gate structure includes a first section and a tilt section, the tilt section having a first end coupled with the first section. The field-effect transistor further comprises a drift region in the semiconductor substrate, the drift region extending laterally from the drain region to at least the gate structure, the drift region being characterized by a first distance between a first sidewall of the drain finger and a second sidewall of the gate structure, wherein the gate structure is laterally tilted away from the drain region at the drain end to a second distance that is greater than the first distance, and wherein the drift region between the first section and the drain finger exhibits the first distance, and the tilt section deviates away from the longitudinal centerline of the drain region at the drain end.

An embodiment of a method of fabricating the semiconductor device comprises forming a source region and a drain region in a semiconductor substrate, the drain region having a drain finger terminating at a drain end, forming a gate structure supported by the semiconductor substrate between the source region and the drain region, the gate structure extending laterally beyond the drain end, and forming a drift region in the semiconductor substrate, the drift region extending laterally from the drain region to at least the gate structure, the drift region being characterized by a first distance between a first sidewall of the drain finger and a second sidewall of the gate structure, wherein the gate structure is laterally tilted away from the drain region at the drain end to a second distance that is greater than the first distance Thus, embodiments include a field-effect transistor (FET), such as a laterally diffused metal-oxide-semiconductor (LDMOS) transistor with a homogeneous and optimized source-to-drain breakdown voltage ($BV_{DSS}$) and fabrication thereof. The breakdown voltage is made homogeneous along the drain finger through the implementation of a drain finger termination configuration in which the area of a drift region is gradually increased in proximity to a drain end of a drain finger to obtain a well-distributed avalanche current at the breakdown voltage along the length of the drain finger. This well-distributed, or homogeneous, avalanche current may enable lower on-state resistance ($R_{ON}$) at high breakdown voltages, thereby enhancing transistor performance and robustness.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An electronic apparatus comprising:
   a substrate; and
   a field-effect transistor device disposed on the substrate, the field-effect transistor device comprising:
      a source region and a drain region disposed in a semiconductor substrate, the drain region having a drain finger terminating at a drain end, the drain region being characterized by a longitudinal centerline;
      a gate structure supported by the semiconductor substrate between the source region and the drain region, the gate structure extending laterally beyond the drain end, the gate structure including a first section and a tilt section, the first section being aligned substantially parallel to the drain finger, and the tilt section having a first end coupled with the first section; and
      a drift region in the semiconductor substrate, the drift region extending laterally from the drain region to at least the gate structure, the drift region being characterized by a first distance between a first sidewall of the drain finger and a second sidewall of the gate structure, wherein the gate structure is laterally tilted away from the drain region at the drain end to a second distance that is greater than the first distance, and wherein the drift region between the first section and the drain finger exhibits the first distance, and the tilt section deviates away from the longitudinal centerline of the drain region at the drain end.

2. The electronic apparatus of claim 1 wherein the first end of the tilt section is spaced apart from the drain finger proximate a junction between the drain finger and the drain end.

3. The electronic apparatus of claim 1 wherein the second end of the tilt section is positioned beyond the drain end.

4. The electronic apparatus of claim 1 further comprising a shield disposed over a portion of the drift region and at least a portion of the gate structure, wherein the shield is aligned with the gate structure such that the shield is laterally tilted away from the drain region at the drain end in correspondence with the gate structure.

5. The electronic apparatus of claim 1 further comprising material layers aligned with the gate structure, the material layers being laterally tilted away from the drain region at the drain end in correspondence with the gate structure.

6. The electronic apparatus of claim 1 wherein the gate structure is laterally tilted away from the drain region at the drain end to gradually increase an area of the drift region at the drain end.

7. A method of fabricating a semiconductor device comprising:
   forming a source region and a drain region in a semiconductor substrate, the drain region having a drain finger terminating at a drain end, and the drain region being characterized by a longitudinal centerline;

forming a gate structure supported by the semiconductor substrate between the source region and the drain region, the gate structure extending laterally beyond the drain end, the gate structure including a first section and a tilt section, the first section being aligned substantially parallel to the drain finger, and the tilt section having a first end coupled with the first section; and forming a drift region in the semiconductor substrate, the drift region extending laterally from the drain region to at least the gate structure, the drift region being characterized by a first distance between a first sidewall of the drain finger and a second sidewall of the gate structure, wherein the gate structure is laterally tilted away from the drain region at the drain end to a second distance that is greater than the first distance, and wherein the drift region between the first section and the drain finger exhibits the first distance, and the tilt section deviates away from the longitudinal centerline of the drain region at the drain end.

8. The method of claim 7 further comprising forming material layers aligned with the gate structure, the material layers being laterally tilted away from the drain region at the drain end in correspondence with the gate structure, the material layers including at least a shield.

\* \* \* \* \*